DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED JULY 6, 1976

948 O.G. 6

T948,006

COATED FILMS

Cyril John Ealding, Puckeridge, near Ware, England, assignor to Imperial Chemical Industries Limited, London, England Filed Sept. 24, 1975, Ser. No. 616,302
Claims priority, application Great Britain, Oct. 18, 1974, 45,205/74
Int. Cl. B32b 27/08
U.S. Cl. 428—515
No Drawing. 15 Pages of Specification Films of polyethylene terephthalate having an ink coating thereon and suitable for use as drafting papers are disclosed. With such films the ink is adhered to the underlying sheet using a new polyvinyl alcohol admixture with other coating materials and the resulting product is substantially or completely devoid of broadening or spreading beyond the intended confines of the lines while maintaining good ink adhesion to the underlying sheet.

The synthetic plastics film is coated on one or both sides of its surfaces with a layer susceptible to marking by hydrophilic inks with a coating of (1) polyvinyl alcohol, or partially hydrolyzed polyvinyl acetate which has been hydrolyzed to a degree of at least 72 mole percent, and preferably 72–88, to provide adhesion of the ink to the film, and (2) from weight percent calculated on the total weights of (1) plus (2), of 10–70 a hydrophobic additive. Component (2) is selected from suitable waxes and polymeric materials including a film-forming or non-film-forming polymer or copolymer of acrylic or methacrylic acid, or an ester of either acid, or a polymer or copolymer of vinyl acetate, copolymerizable monomers for the acrylates include styrene, alkyl substituted styrene, acrylonitrile, methacrylonitrile, vinyl acetate, methacrylic acid, acrylic acid, maleic acid, fumaric acid, itaconic acid, crotonic acid, acrylamide and methacrylamide. Conventional coating additives may be included in the coating layer. Various plastics film bases may be used; biaxially oriented polyethylene terephthalate films are preferred.

Specific hydrophobic additives (2) include: copolymers of ethylacrylate, methyl methacrylate and methacrylic acid, and an aqueous emulsion of homopolyvinyl acetate. Coating weights of the dried coating layer, in terms of the weight of component (1), range from 0.04 to 0.3 g./m.$^2$